United States Patent
Letor et al.

(10) Patent No.: US 12,316,072 B2
(45) Date of Patent: May 27, 2025

(54) PULSE GENERATOR CIRCUIT, RELATED SYSTEM AND METHOD

(71) Applicants: STMicroelectronics (Rousset) SAS, Rousset (FR); STMicroelectronics S.r.l., Agrate Brianza (IT)

(72) Inventors: Romeo Letor, Mascalucia (IT); Vanni Poletto, Milan (IT); Antoine Pavlin, Puyricard (FR); Alfio Russo, Acireale (IT); Nadia Lecci, Tremestieri Etneo (IT)

(73) Assignees: STMICROELECTRONICS (ROUSSET) SAS, Rousset (FR); STMICROELECTRONICS S.R.L., Agrate Brianza (IT)

( * ) Notice: Subject to any disclaimer, the term of this patent is extended or adjusted under 35 U.S.C. 154(b) by 921 days.

(21) Appl. No.: 17/338,157

(22) Filed: Jun. 3, 2021

(65) Prior Publication Data

US 2022/0014187 A1    Jan. 13, 2022

(30) Foreign Application Priority Data

Jul. 7, 2020   (IT) .................. 102020000016423

(51) Int. Cl.
*H01S 5/042* (2006.01)
*H01S 5/062* (2006.01)

(52) U.S. Cl.
CPC ........ *H01S 5/0428* (2013.01); *H01S 5/06216* (2013.01)

(58) Field of Classification Search
None
See application file for complete search history.

(56) References Cited

U.S. PATENT DOCUMENTS

| | | |
|---|---|---|
| 5,736,881 A | 4/1998 | Ortiz |
| 5,936,598 A | 8/1999 | Hayama |

(Continued)

FOREIGN PATENT DOCUMENTS

| | | |
|---|---|---|
| CN | 106063104 A | 10/2016 |
| EP | 3629462 A1 | 4/2020 |

(Continued)

OTHER PUBLICATIONS

OSRAM, "LiDar Teach-In," OSRAM Licht AG, Jun. 20, 2018, 22 pages, Munich, DE.

*Primary Examiner* — Minsun O Harvey
*Assistant Examiner* — Fernanda Adriana Camacho Alanis
(74) *Attorney, Agent, or Firm* — Slater Matsil, LLP (57) ABSTRACT

A pulse generator circuit includes: an LC resonant circuit coupled between a first node and a reference node; a first switch coupled between the first node and the reference node; a switching network comprising a second switch coupled between the first node and a respective drive node; and drive circuit having outputs coupled to the first switch and to the second switch of the switching network. The drive circuit is configured to, in repeating cycles: close the first switch so that a current flowing through an inductor of the LC resonant circuit increases during a resonant cycle, when the current flowing through the inductor reaches a threshold value, open the first switch, close the second switch of the switching network for a pulse duration time when the first switch is open, and open the second switch at an expiration of the pulse duration time.

21 Claims, 7 Drawing Sheets

(56) References Cited

U.S. PATENT DOCUMENTS

| | | |
|---|---|---|
| 9,368,936 B1 | 6/2016 | Lenius et al. |
| 2003/0016711 A1 | 1/2003 | Crawford |
| 2007/0262724 A1* | 11/2007 | Mednik .................. H05B 45/48 |
| | | 315/125 |
| 2010/0315572 A1* | 12/2010 | LoCascio ............... H05B 45/44 |
| | | 349/61 |
| 2015/0002115 A1 | 1/2015 | Shenoy et al. |
| 2017/0085057 A1* | 3/2017 | Barnes ................ H01S 5/06808 |
| 2018/0109074 A1 | 4/2018 | Gassend et al. |
| 2018/0188360 A1 | 7/2018 | Berger et al. |
| 2018/0278017 A1 | 9/2018 | Mignoli et al. |
| 2018/0375503 A1 | 12/2018 | Lin |
| 2018/0375504 A1 | 12/2018 | Lin |
| 2019/0229493 A1 | 7/2019 | Stern |
| 2019/0386460 A1 | 12/2019 | Barnes et al. |
| 2020/0178361 A1* | 6/2020 | Oka ...................... G01S 7/4815 |
| 2020/0388987 A1 | 12/2020 | Moore |
| 2021/0098965 A1* | 4/2021 | Crawford ............. H02M 3/158 |
| 2021/0218223 A1 | 7/2021 | Letor et al. |
| 2021/0305770 A1* | 9/2021 | Colles .................. H01S 5/0261 |
| 2021/0333362 A1* | 10/2021 | Huang .................... G01S 17/10 |
| 2022/0013984 A1 | 1/2022 | Letor et al. |
| 2022/0224075 A1* | 7/2022 | Matsuoka .......... H03K 17/6871 |

FOREIGN PATENT DOCUMENTS

| | | |
|---|---|---|
| JP | 6188579 A | 5/1986 |
| JP | 2009260030 A | 11/2009 |
| WO | 2018041867 A1 | 3/2018 |

\* cited by examiner

PULSE GENERATOR CIRCUIT, RELATED SYSTEM AND METHOD

This application claims the benefit of Italian Patent Application No. 102020000016423, filed on Jul. 7, 2020, which application is hereby incorporated herein by reference.

TECHNICAL FIELD

The description relates to pulse generator circuits. One or more embodiments are applicable, for instance, in pulse generator circuits for driving laser diode arrays.

BACKGROUND

Due to their 3D capability and the ability to operate in unfavorable weather conditions/darkness, LIDAR (LIght Detection And Ranging or Laser Imaging Detection And Ranging) systems are increasingly used, in possible combination with radar systems and cameras, for environment mapping and other safety applications such as emergency braking, pedestrian detection and collision avoidance in the automotive sector.

Very short high-current pulses (such as current pulses having intensities in the range of tens of Ampere with rise and fall times in the (sub)nanosecond time range, e.g. in the order of 100 ps) are desirable for laser diodes for LiDAR systems used to measure distances using Time of Flight (ToF) techniques over the mid, short distance range.

Laser diodes arrays comprising laser diodes activated in sequence or in parallel are also used to improve the signal-to-noise (S/N) ratio in the received back signal. Multichannel drivers offer the possibility of selecting the diode(s) to be activated with a narrow current pulse of high intensity.

Generation of such high-intensity narrow pulses represents a challenge in the design of a laser diode driver.

Precise control of the pulse duration cannot be obtained solely by acting on the switching times of a power switch: for instance, the parasitic inductances of the interconnections limit di/dt during current rise and fall and strongly influence the pulse duration. Additional problems arise when driving multiple laser diodes connected with common cathodes in an array.

SUMMARY

In accordance with an embodiment, a pulse generator circuit includes: an LC resonant circuit coupled between a first node and a reference node; a charging circuit coupled to the LC resonant circuit; a first electronic switch coupled between the first node and the reference node in parallel with the LC resonant circuit; a switching network comprising a second electronic switch coupled between the first node and a respective drive node of the switching network, the respective drive node configured to be coupled to a respective electrical load; and drive circuit having outputs coupled to the first electronic switch and to the second electronic switch of the switching network. The drive circuit configured to, in repeating cycles: close the first electronic switch so that a current flowing through an inductor of the LC resonant circuit increases during a resonant cycle, when the current flowing through the inductor reaches a threshold value, open the first electronic switch, close the second electronic switch of the switching network for a pulse duration time when the first electronic switch is open, wherein the current flowing through the inductor is commutated toward the second electronic switch and the respective drive node, and open the second electronic switch at an expiration of the pulse duration time.

In accordance with another embodiment, a laser diode system includes: a pulse generator comprising an LC resonant circuit coupled between a first node and a reference node, a first electronic switch coupled between the first node and the reference node in parallel with the LC resonant circuit, and a plurality of switching networks that each comprises a second electronic switch coupled between the first node and a respective drive node of the switching network, wherein the respective drive node is configured to be coupled to a respective laser diode of a plurality of laser diodes; and a driver circuit. The driver circuit is configured to: close the first electronic switch so that a current flowing through an inductor of the LC resonant circuit increases during a resonant cycle, sequentially close the second switches of the plurality of switching networks for respective pulse duration times, wherein during each respective pulse duration time, wherein the second electronic switch of one switching network of the plurality of switching networks is closed while second electronic switches of the other switching networks of the plurality of switching networks are open, and open each second switch of the plurality of switching networks after an expiration of its respective pulse duration time.

In accordance with a further embodiment, a method of operating a pulse generator circuit includes a number of steps. The pulse generator circuit includes an LC resonant circuit coupled between a first node and a reference node, a first electronic switch coupled between the first node and the reference node in parallel with the LC resonant circuit, and a plurality of switching networks that each comprises a second electronic switch coupled between the first node and a respective drive node associated with its respective switching network, the drive node configured to be coupled to a respective electrical load of a plurality of electrical loads. The method includes the steps of: closing the first electronic switch so that a current flowing through an inductor of the LC resonant circuit increases during a resonant cycle; sequentially closing the second switches of the plurality of switching networks for respective pulse duration times, wherein during each respective pulse duration time, wherein a second electronic switch of one switching network of the plurality of switching networks is closed while second electronic switches of the other switching networks of the plurality of switching networks are open; and opening each second switch of the plurality of switching networks after the expiration of its respective pulse duration time.

BRIEF DESCRIPTION OF THE DRAWINGS

The features and advantages of embodiments will become apparent from the following detailed description of practical implementations thereof, shown byway of non-limiting example in the accompanying figures, wherein.

DETAILED DESCRIPTION OF ILLUSTRATIVE EMBODIMENTS

In the ensuing description, various specific details are illustrated aimed at enabling an in-depth understanding of the embodiments. The embodiments maybe provided without one or more of the specific details, or with other methods, components, materials, etc. In other cases, known structures, materials, or operations are not shown or described in detail so that various aspects of the embodiments will not be obscured.

Reference to "an embodiment" or "one embodiment" in the framework of this description is meant to indicate that a particular configuration, structure, or characteristic described in relation to the embodiment is comprised in at least one embodiment. Hence, phrases such as "in an embodiment", "in one embodiment", or the like that may be present in various points of this description do not necessarily refer to one and the same embodiment. Moreover, particular conformations, structures, or characteristics may be combined in any adequate way in one or more embodiments.

The headings/references used herein are only provided for convenience and hence do not define the sphere of protection or the scope of the embodiments.

Throughout the figures, like parts, elements or components are designated by like reference symbols and a detailed description will not be repeated for each and every figure in order not to burden the present detailed description.

Similarly, throughout this description, a same designation may be used for simplicity to indicate a certain circuit node or line and a signal occurring at that node or line.

By way of introduction to a detailed description of illustrative embodiments, it is noted that generating high-current narrow pulses represents a challenge in designing drivers of pulsed operation systems, that is systems intended to operate in a pulsed manner.

For instance, laser diode drivers with rise and fall times in the 100 ps range are desirable insofar as reducing inasmuch as possible pulse duration facilitates maintaining the energy emitted by a laser below safety limits.

At a laser driver level this translates into providing very high values for di/dt that is the time derivative of the current generated by the driver, which is expected to be able to commutate (switch) high currents in a very short time. This problem does not arise in low-power systems, where the issue of a high di/dt is hardly considered.

In drivers where continuous high current operation is not a goal pursued, current generation may involve a DC-DC converter.

It is noted that managing high DC currents leads to expensive DC-DC converters with high power dissipation; by way of contrast, a pulsed current generator using a resonant tank is simple, cheap, controllable and has a low power dissipation.

Lasers can be activated with a limited frequency in order to limit the power dissipation in the laser diodes.

A pulsed current can be generated using a resonant tank (an LC resonant circuit), with the inductor of the resonant tank behaving as a current generator during a time window where the current can be considered constant.

The laser diodes in an array can be activated in sequence, in a "circular" activation sequence in order to have (always) one diode active at a time.

It is noted that such an approach can be combined with high values for di/dt with the current deviated in one of the laser diodes in the array. This generates a commutation loop that can be very short physically, with no passive elements in the commutation loop. This facilitates achieving (very) high values for di/dt, for instance if fast electronic switches (Gallium Nitride or GaN transistors, for instance) are used.

As discussed, generation of high-intensity narrow pulses represents a challenge in the design of laser diode drivers with expected rise and fall times are in the 100 ps range. The switching times of a power switch may not suffice in providing a precise control of the pulse duration cannot insofar as the parasitic inductances in interconnections may limit di/dt during current rise and fall and adversely affect pulse duration.

Various additional problems arise in generating high-intensity narrow pulses. These problems may include, for instance:

a supply voltage (much) higher than laser diode drop can be expected to facilitate generating a high di/dt as desired;

a supply voltage higher than the laser diode voltage drop may in turn generate safety issue in case the laser diode is accidentally and permanently connected to a supply voltage (this may occur as a result of an actuator failure in an "on" state);

inductive voltage overshoot may damage a laser diode;

generation of several pulses within a short time frame may be critical insofar as in conventional systems a "next" pulse can be generated only after recharging a capacitor used as a fast energy source; and pulse current amplitude may be difficult to control.

Also, driving arrays comprising plural laser diodes in a common-cathode configuration may involve driving each laser diode via a switch (a FET, for instance) having its drain connected to a supply voltage Vcc, and parasitic capacitances can generate spurious pulses in the temporarily inactive laser diodes.

It is otherwise noted that at least some of the issues discussed in the foregoing may arise in driver systems intended for use in connection with electrical loads different from laser diodes.

Consequently, while laser diodes will be referred to in the rest of this description for exemplary purposes, the embodiments are not limited to use in laser drivers.

Figure 1:
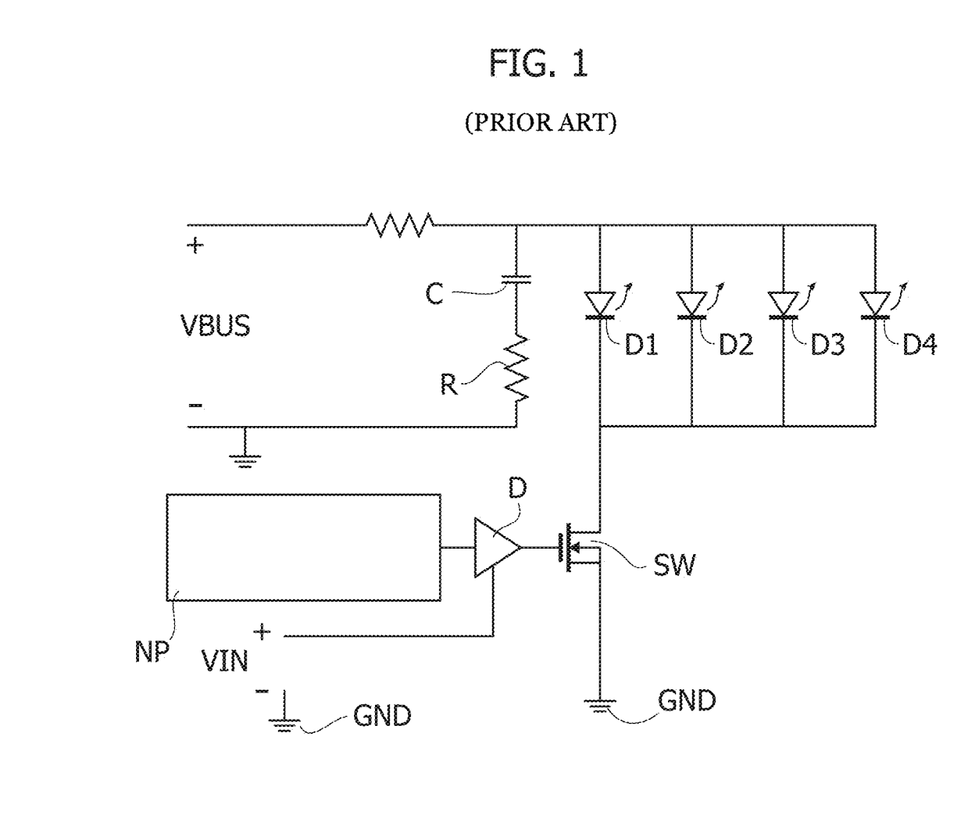
FIG. 1 is a block diagram exemplary of a conventional system comprising an array of laser diodes and an associated pulse generator.

FIG. 1 is a general representation of a conventional system comprising plural (four, for instance) laser diodes D1, D2, D3, D4 in a common anode—common cathode configuration supplied (at their anodes) via a supply bus at a voltage VBUS (referred to ground GND) via a RC circuit.

The cathodes of the laser diodes D1, D2, D3, D4 are jointly coupled to an associated electronic switch such as a field-effect transistor or FET.

The switch SW is selectively activatable to a closed state (switch made conductive) to pull the cathodes of the laser diodes D1, D2, D3, D4 to ground, so that light is emitted by the forward-polarized diodes D1, D2, D3, D4.

Operation of the switch SW is controlled via a driver stage D coupled to the control terminal (gate, in the case of a field-effect transistor) of the switch SW.

Operation of the driver stage D, which receives an input voltage VIN (referred to ground GND), is controlled by a narrow pulse generator NP.

Figure 1A:
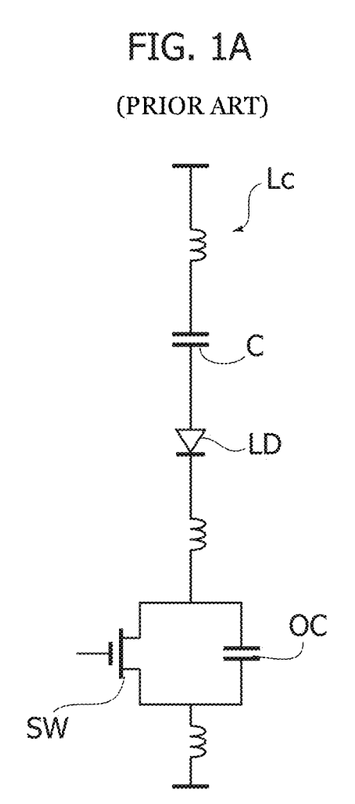
FIG. 1A is a circuit diagram of an equivalent circuit of a commutation loop in the system of FIG. 1.

FIG. 1A illustrates an equivalent circuit of a corresponding commutation loop.

In FIG. 1A, the symbol LD generally denotes a laser diode, illustrated with an associated series parasitic inductance.

SW is the electronic switch (implemented as a FET, for instance) illustrated with an associated output capacitance OC (in parallel) and an associated series parasitic inductance.

As illustrated, a ceramic capacitor C can be used as a fast energy storage to drive a pulse current in the laser diode LD using the fast power switch SW connected in series with the capacitor C and with the laser diode in a commutation loop.

Parasitic (stray) inductances of the interconnections of the commutation loop are illustrated in FIG. 1A and cumulatively indicated as Lc, which can be in excess of 1 nH.

Solutions as illustrated in FIGS. 1 and 1A suffer from a number of drawbacks:

the stray inductance(s) cannot be reduced as desirable to obtain a high value for di/dt (for instance, 100 ps rise and fall times of high amplitude current pulses) insofar as the length of the commutation loop is influenced by the capacitor size;

a supply voltage (much) higher than the laser voltage facilitates obtaining a high value for di/dt (V=Ldi/dt) but, on the other hand, may lead to a (very) high power dissipation in the presence of a high laser activation frequency: at each commutation the switch SW will dissipate the energy E of its output capacitance OC where E=½ COC*VOC2 where COC is the capacitance value of OC and VOC is the voltage across OC;

the value of laser diode current is difficult to control via the capacitor discharge process only: in fact, the current will ultimately depend on the impedance of the commutation loop;

multi-channel drivers along the lines of the general architecture of FIG. 1 with laser diode selection (that is, the capability of activating individually each one of the diodes D1, D2, D3 and D4 separately) involves a corresponding number (four, for instance) of switches in a HS configuration since the laser diode array comprises laser diodes in a common-cathode configuration; and countering undesired spurious activation of non-selected laser diodes (as possibly generated by the resonance of stray inductances with stray capacitances in the commutation loop) will involve additional switches arranged in parallel to the laser diodes.

Figure 2:
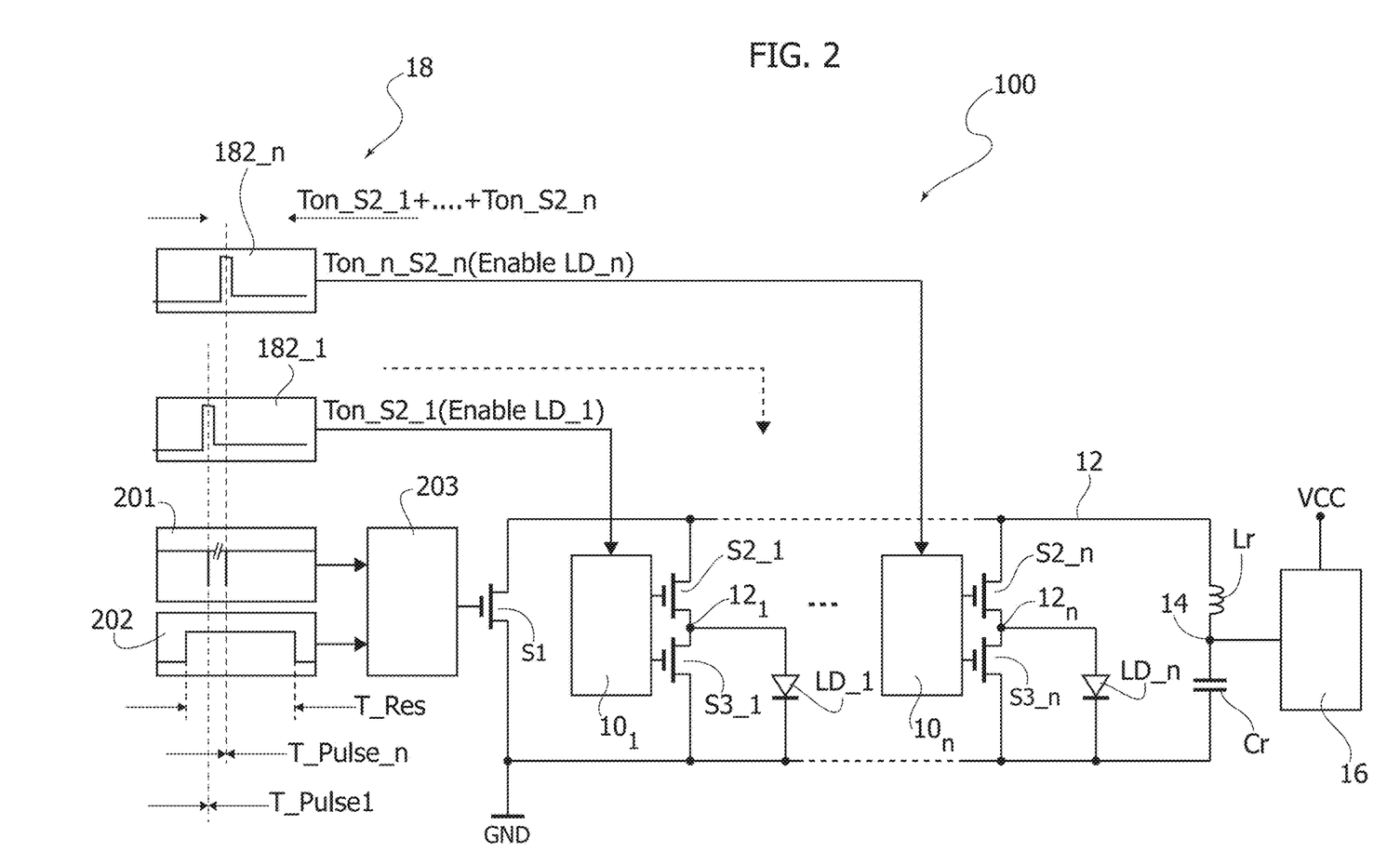
FIG. 2 is a block diagram of an implementation of embodiments of the present description.
Figure 3:
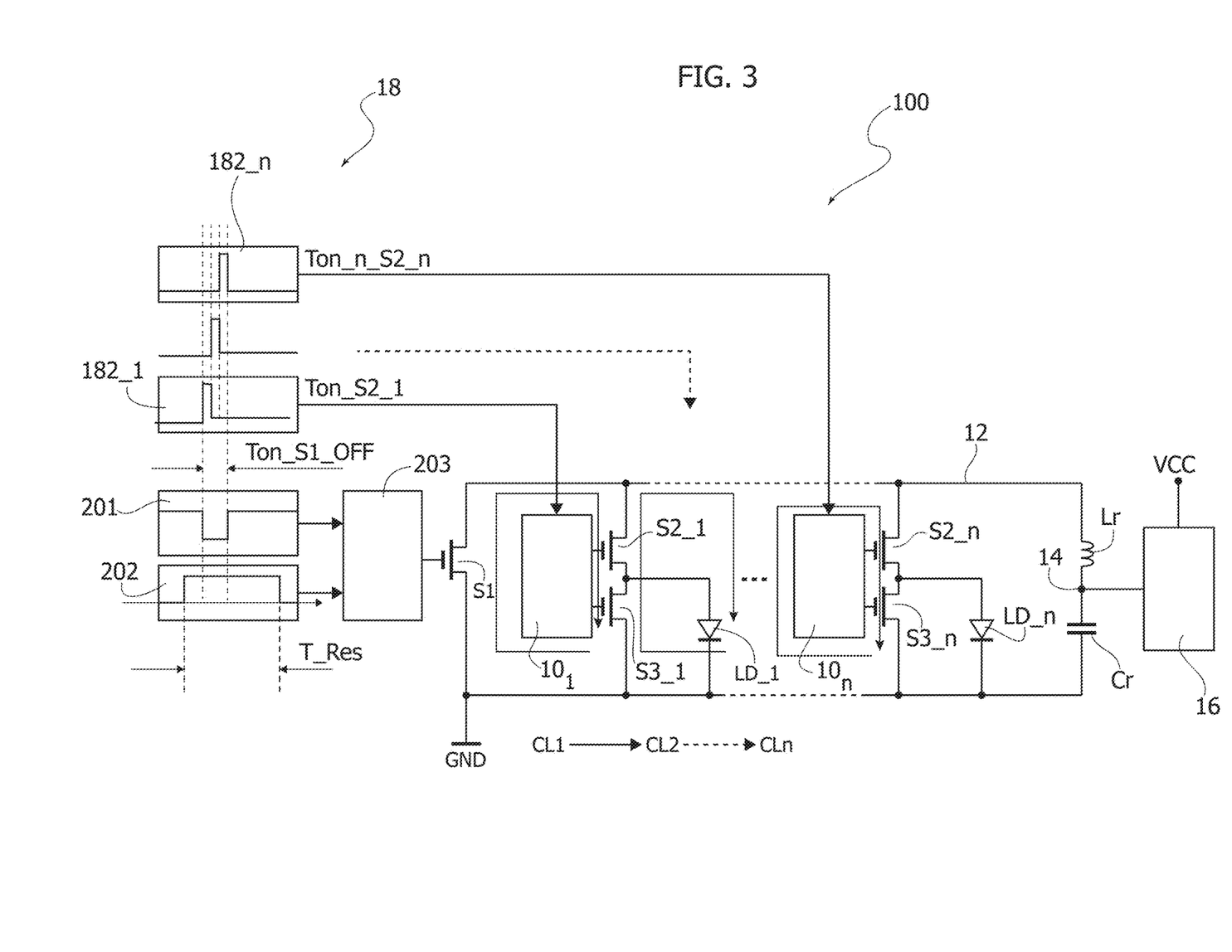
FIG. 3 is a block diagram exemplary of operation of embodiments of the present description.
Figure 4:
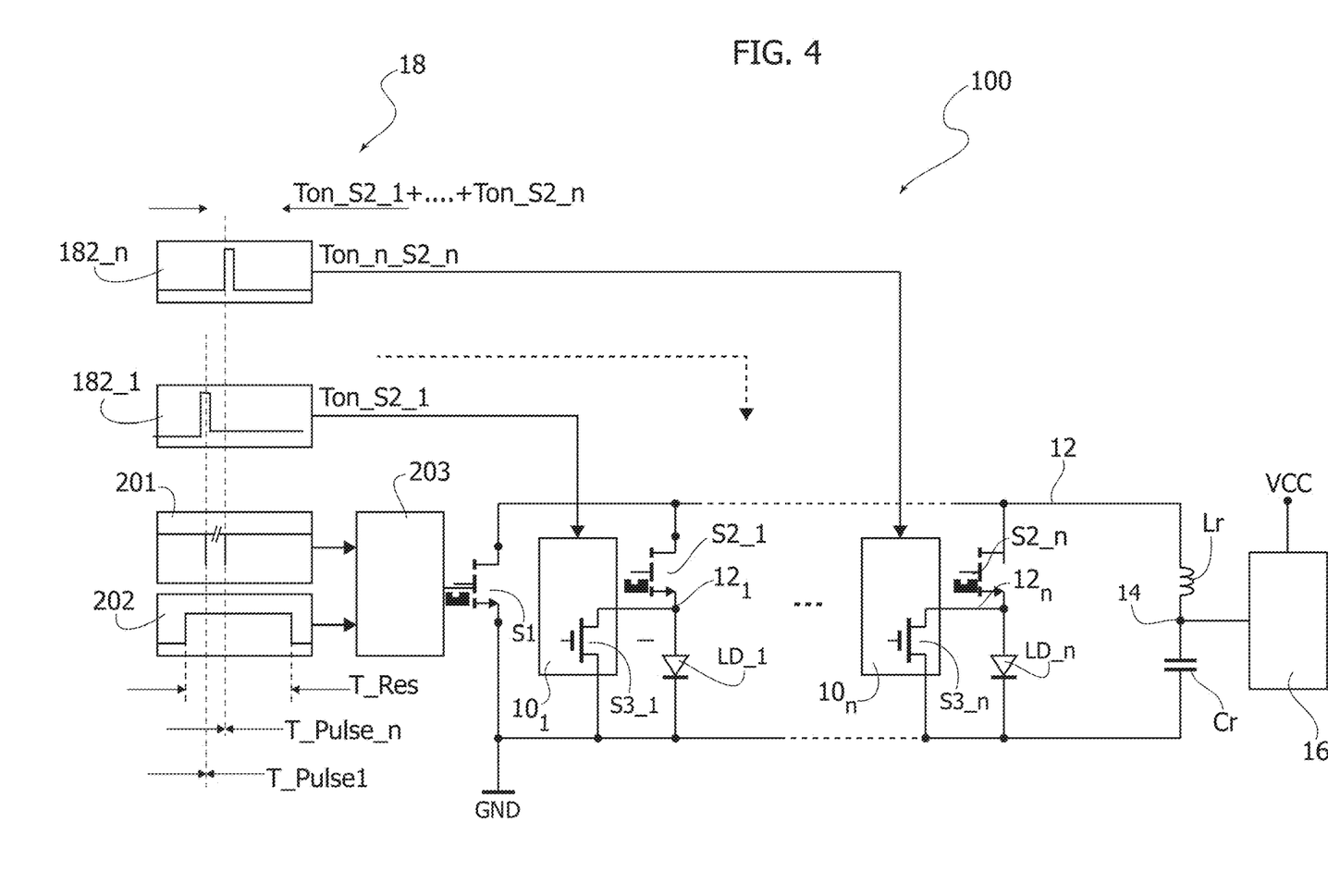
FIG. 4 is a block diagram of an implementation of embodiments of the present description.

In one or more embodiments, issues as discussed in the foregoing can be addressed with pulse generator circuits as illustrated in FIGS. 2, 3 and 4.

Throughout these figures (and in the other figures as well) like parts, elements or components are designated with like reference symbols and a corresponding detailed description will not be repeated for brevity.

In figures such as FIGS. 2, 3 and 4 the reference symbols LD_1, LD_2, . . . , LD_n denote a number n (n=1, 2, . . . ) of laser diodes which may form an array as discussed in the foregoing. For instance, byway of non-limiting example, n=4.

Also, the electrical loads here represented by laser diodes LD_1, LD_2, . . . , LD_n may be distinct elements with respect to a pulse generator circuit 100 as per the embodiments. For instance, the laser diodes LD_1, LD_2, . . . , LD_n or other electrical loads may be intended to be coupled with pulse generator circuit 100 only by a final customer/user.

As noted, while laser diodes will be referred to in the rest of this description for exemplary purposes, the embodiments are not limited to use in laser drivers.

As illustrated (and to some extent conventional in the art) the laser diodes LD_1, LD_2, . . . , LD_n are configured to be selectively activated (in a pulsed manner) via respective half-bridges S2_1, S3_1 (laser diode LD_1), . . . , S2_n, S3_n (laser diode LD_n), driven by respective drive circuits 101, . . . , ion coupled to the control terminals (gates in the case of field-effect transistors) of the switches in the half-bridges S2_1, S3_1, . . . , S2_n, S3_n. Drive circuits 10$_1$, . . . , 10$_n$ may be implemented using half-bridge driver circuits known in the art.

As illustrated, the half-bridges S2_1, S3_1, . . . , S2_n, S3_n comprise electronic switches such as field-effect transistors with each half bridge comprising:

a switch S2_1, . . . S2_n coupled between a first node or line 12 (common to all the half-bridges) and a second node 12$_1$, . . . , 12n a switch S3_1, . . . S3_n coupled between the second node 12$_1$, . . . , 12n and a reference node or line (for instance, ground GND).

As illustrated, the laser diodes LD_1, . . . , LD_n are coupled (at their anodes) to the second nodes 12$_1$, . . . , 12n of the respective half-bridges S2_1, S3_1, . . . , S2_n, S3_n, thus being arranged between the second nodes 12$_1$, . . . , 12n and the reference node or line (here, ground GND) in a common cathode configuration.

Notation such as S2_j, s3_j and LD_j, 10j, 12j and the like (assuming j=1, . . . , n) will be used in the following in order to avoid making this description unduly complicated.

An LC resonant tank including an inductor Lr and a capacitor Cr connected in series is provided coupled between the first node or line 12 and the reference node GND. As illustrated, the inductor Lr is arranged intermediate the first node or line 12 and an intermediate node 14 of the resonant tank circuit and the capacitor Cr is arranged intermediate the node 14 and the reference node GND.

The node 14 is coupled to a charge circuit (regulator) which receives a supply voltage VCC.

A switch S1—an electronic switch such as a Gallium Nitride (GaN) field-effect transistor—is coupled intermediate the first node or line 12 and the reference node GND.

The (first) switch S1 and the switches S2_j, S3_j are actuated as a function of enable signals provided, as discussed in the following, by control circuitry designated 18 as a whole.

Merely for the sake of ease of description and understanding, the control circuitry 18 may be regarded as comprising:

respective control circuits 182_1, . . . , 182_n (182_j) for the half-bridges S2_1, S3_1, . . . , S2_n, S3_n, configured to send to the half-bridges S2_1, S3_1, . . . , S2_n, S3_n respective enable signals Ton_S2_1, . . . , Ton_S2_n (Ton_S2_j) to energization of (and thus light emission from) the respective laser diode LD_1, . . . , LD_n, two further control circuits 201, 202 configured to control via an AND gate 203 the switch S1 (e.g. via the control electrode thereof, a gate in the case of a field-effect transistor as exemplified herein).

As noted, the control circuits 182_j, 201, 202 and 203 are represented as distinct entities merely for the sake of ease of description and understanding. In fact these control circuits lend themselves to being integrated to a single unit 18 (see also FIGS. 5 and 6 and the related description). Control circuits 182_j, 201, 202 and 203 may be implemented using digital logic circuit design techniques known in the art. For example, the digital logic circuits may be implemented using one or more state machine circuits, and/or using logic synthesized to perform the functions described herein.

It will be otherwise appreciated that embodiments herein are primarily concerned with coordination of operation of the "first" switch S1 with operation of the "second" switches S2_j and the "third" switches S3_j in order to achieve generation of high di/dt (ultra)short pulses which are commutated onto the laser diodes LD_j to obtain selective individual activation and light emission therefrom.

One or more embodiments as exemplified herein may in fact comprise at least one switch (namely S1, common to all the laser diodes LD_1, ..., LD_n in the array) to energize a the resonant tank Lr, Cr defining energy content and peak current of the laser diode pulses and at least one second switch, namely s2_j (j=1, ..., n) in series with a respective laser diode LDj for selection (in view of laser diode activation and light emission therefrom).

As illustrated herein by way of example, the laser diodes LDj (j=1, ..., n) are in a common cathode configuration with:

at least one "second" switch S2_j arranged in series to the anode of a respective laser diode LD_j, at least one "third" switch S3_j (j=1, ..., n) arranged in parallel to a respective laser diode LDj.

Consequently, each group of a second switch S2_j, a third switch S3_j, and a respective laser diode LD_j provides a j-th laser channel activatable by an associated half-bridge drive 10j (j=1, ..., n).

The regulator 16 can be implemented in a manner known per se in such a way to charge the capacitor Cr in the resonant tank at a voltage adequate to obtain a peak current in the resonant tank Lr, Cr equal or higher than a desired laser diode pulse current. In some embodiments, regulator 16 may be implemented, for example, using a resistor coupled between VCC (or a regulated voltage source) and a node 14.

Italian patent application No. 102019000029132 and corresponding U.S. patent application Ser. No. 17/123,712, as well as Italian patent application No. 102020000016396 filed on the same date as the application to which the present application claims priority provide exemplary descriptions of such a charge circuitry. U.S. application Ser. No. 17/123, 712 is incorporated herein by reference.

For instance, in an exemplary implementation as illustrated in FIG. 2, the second and third switches S2_j and S3_j can be driven by the control circuitry 18 in a half-bridge configuration so that:

when S2_j is on (that is conductive), S3_j is off (non-conductive) and the laser diode LD_j can be activated when S2_j is on (conductive) so that current is injected into the laser diode LD_j in the respective light emission channels;

when S2_j is off, the switch S3_j is on, thus countering undesired spurious currents flowing through the laser diode LD_j.

The switch S1, which is common to all the light emission channels, is connected (in parallel) with the resonant tank Lr, Cr circuit, which is likewise common to all the light emission channels, connected (mutually in parallel) with S1 and hence also to the resonant tank Lr, Cr.

FIGS. 2A to 2E are exemplary of a possible sequence that results in pulses generated in selected laser diodes in an array comprising four laser diodes LD_1, LD_2, LD_3 and LD_4.

Figure 2A:
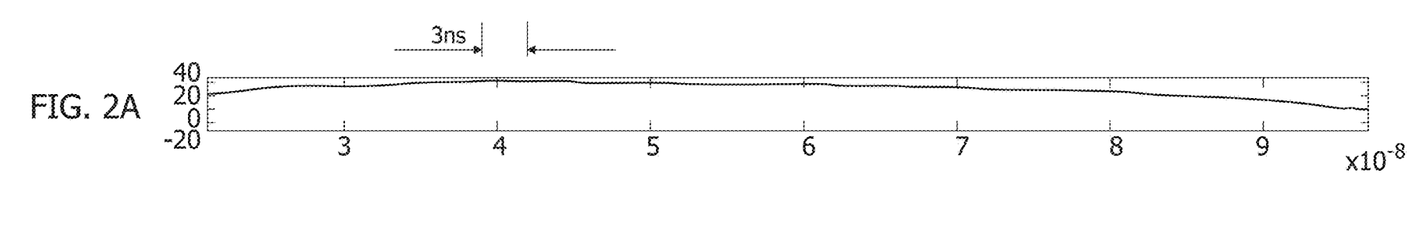
FIGS. 2A to 2E are diagrams illustrative of possible time behaviors of various signals which may occur in embodiments of the present description.
Figure 2B:
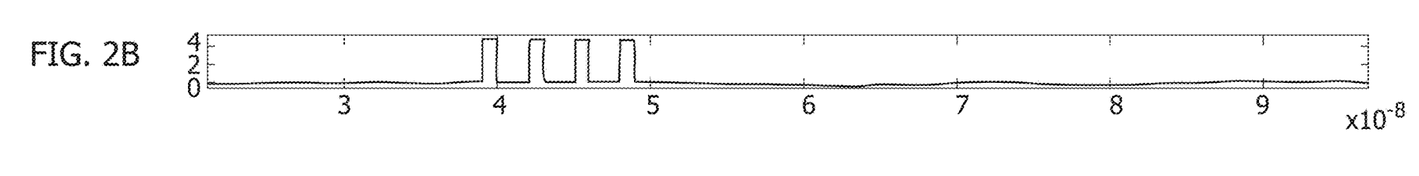
Figure 2C:
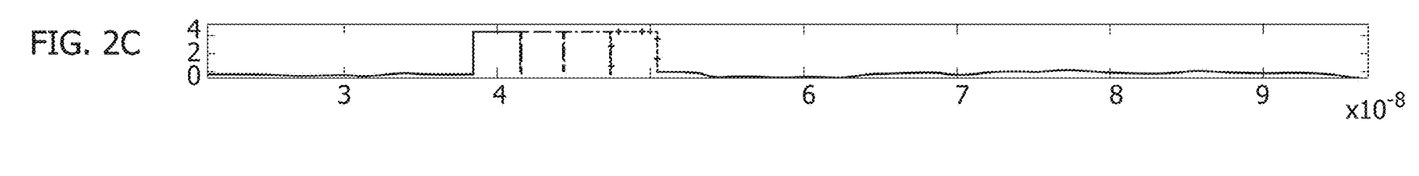
Figure 2D:
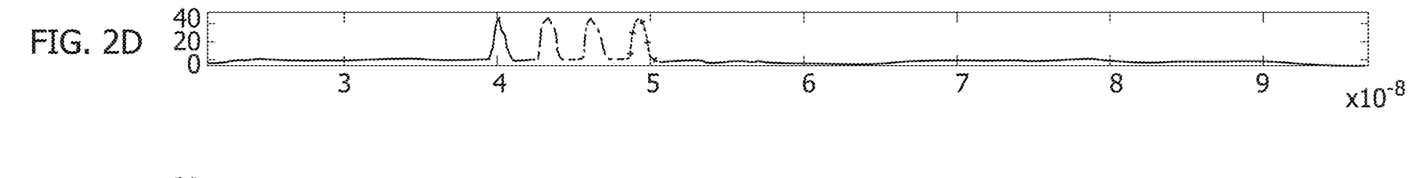
Figure 2E:
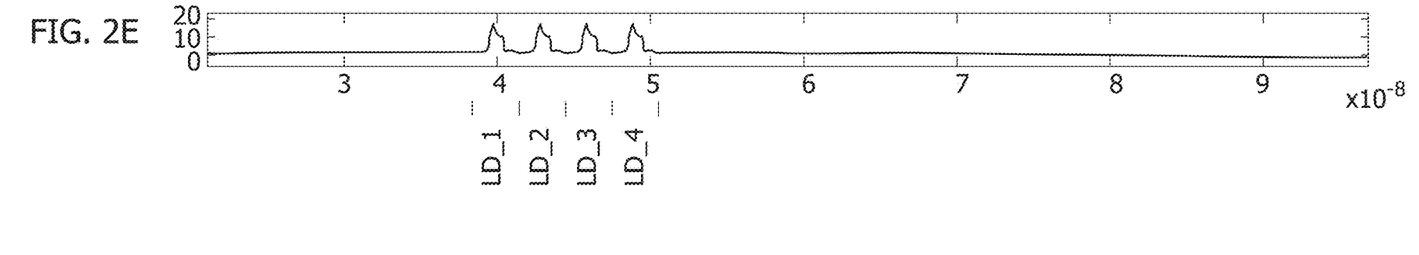

Specifically, FIGS. 2A to 2E represent, against a common time (abscissa) scale possible time behaviors of:

the resonant tank current—FIG. 2A;

the laser firing command signal as provided to the switches S2_j—FIG. 2B;

the laser channel enable signal Enable LD_j from the blocks 182_j (j=1, ..., n)—FIG. 2C;

the laser currents in LD_1, LD_2, LD_3 and LD_4—FIG. 2D; and the VDS (drain-source) voltages in the switches S2_j—FIG. 2E.

For clarity, in Figures such as FIGS. 2C and 2D, a different representation (continuous line ______, dashed line ----, chain line -.-.-.-.-, cross line --+---+---+--) is used for the signals for the various LD channels in those intervals where these signal differ.

Exemplary, non-limiting values for parameters in an arrangement as illustrated in FIG. 2 operated as exemplified in FIGS. 2A to 2E may include those reported in the following TABLE I.

TABLE I

| Exemplary Parameters | |
| --- | --- |
| Lr (nH) | 10 |
| Cr (nF) | 100 |
| VCC (V) | 16 |
| Tres (ns) | 200 |
| N pulses | 1 x channel |
| Pulse width (ns) | 1 |
| Delays (ns) | 3 |
| I pulses (A) | 40 |
| MAX Variation | Less than 1% |
| Driver power (W) | 4.0 |
| Laser power (W) | 0.7 |

In operation as exemplified in FIGS. 2A to 2E, laser current pulses are generated with a delay (3 ns, for instance) between pulses (this is highlighted also in the representation of the blocks 182_j on the left-hand side of FIG. 2) but in a same resonant period of the resonant tank Lr, Cr (see the almost "flat" behavior in FIG. 2A).

The capacitor Cr is charged at a voltage value which is adequate to obtain a desired current in the resonant tank Lr, Cr.

When S1 is switched on (closed or made conductive), the resonant tank Lr, Cr starts to oscillate and the current rises in the inductor Lr.

A selected one of the "second" switches S2_j corresponding to the laser LD_j desired to be activated is switched on (made conductive) in response to a laser diode enable signal issued by a corresponding block 182_j.

In response to the current of the resonant tank Lr, Cr reaching a threshold, S1 is switched off (made non-conductive) for a time corresponding to the laser pulse length (duration time) as desired (1ns, for instance).

During this time, the inductor Lr behaves essentially as a current generator, and current will continue to flow in the laser LD_j activated by the switch S2_j brought to the on (conductive) state.

At the expiration of the pulse duration time, the switch S2_j is switched off (made non-conductive).

Another laser diode (in those arrangement including plural laser diode, that is n>1) or even the same laser diode can be activated during a same pulse produced by the resonant circuit Lr, Cr via a sub-sequence comprising:

S2_j switched on (made conductive);

S1 switched off (non-conductive) for a time duration equal to the pulse duration in the laser diode;

S2_j switched off (non-conductive).

Such a sub-sequence can be repeated a number of times compatible with the gradual discharging or the resonant tank Lr, Cr, with the switch S1 remaining on (conductive) until expiration of the resonance period of Lr, Cr.

When such a time is reached, at a zero crossing current, S1 can be switched off and the voltage on Cr will rise towards a value defined by the residual energy of the resonant tank Lr, Cr.

FIGS. 3 and 3A to 3E are exemplary of embodiments where laser diodes LD_j (j=1, . . . , n) are activated in a sequence of contiguous (that is virtually touching) without delays between pulses (this is highlighted also in the representation of the blocks 182_j on the left-hand side of FIG. 3).

FIGS. 3A to 3E are exemplary of a possible corresponding sequence that generates pulses in an array again comprising four laser diodes LD_1, LD_2, LD_3 and LD_4.

Figure 3A:
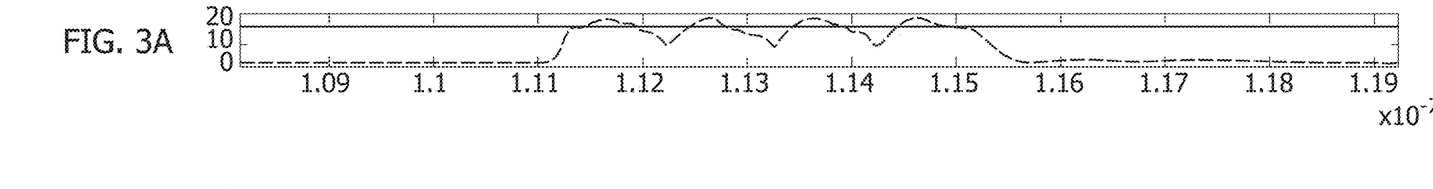
FIGS. 3A to 3E are diagrams illustrative of possible time behaviors of various signals which may occur in embodiments of the present description.
Figure 3B:
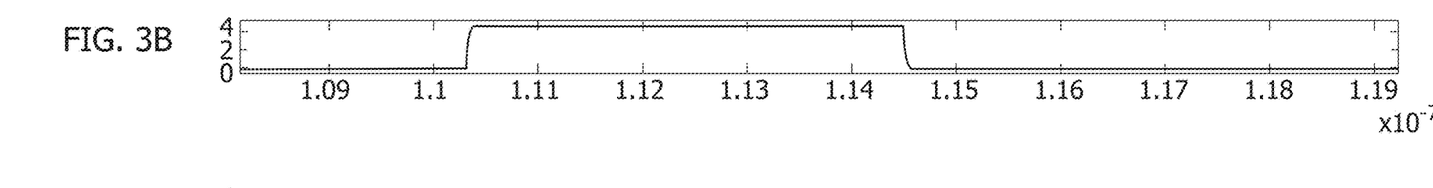
Figure 3C:
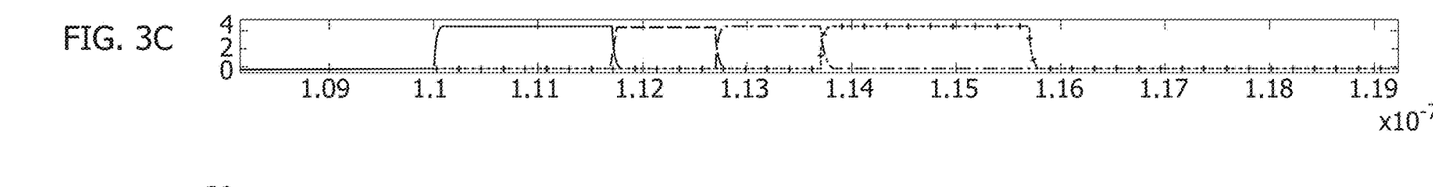
Figure 3D:
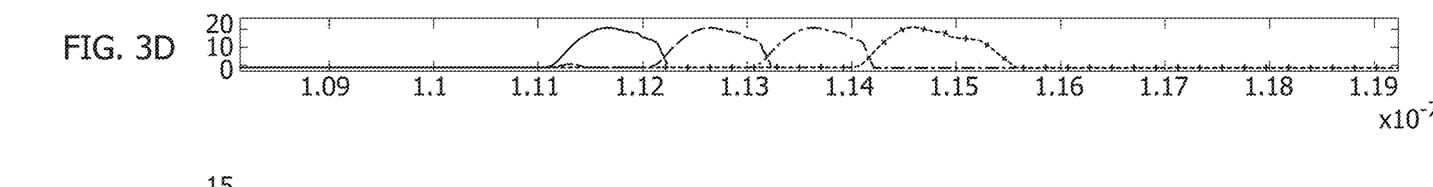
Figure 3E:
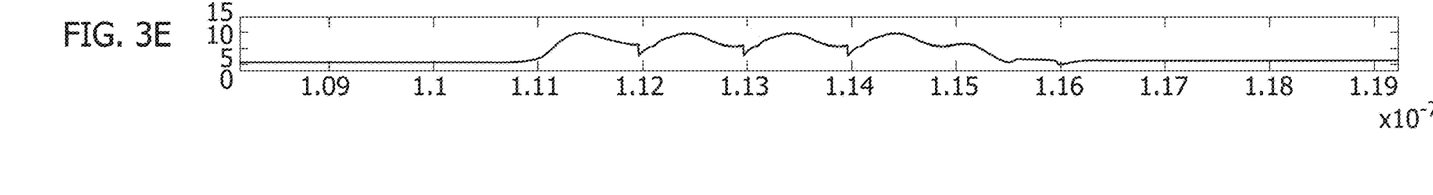

Specifically, FIGS. 3A to 3E represent, against a common time (abscissa) scale, possible time behaviors of:

the resonant tank current and total laser current—FIG. 3A;

the S1 command (inverted: S1 is off when the command is high; see the blocks 201, 202 and 203)—FIG. 3B;

the laser channel commands, that is the enable signals Enable LD_j from the blocks 182_(j=1, . . . , n)—FIG. 3C;

the laser currents in LD_1, LD_2, LD_3 and LD_4—FIG. 3D; and the drain-source voltage across the switch S1—FIG. 2E.

Here again, in figures such as FIGS. 3C and 3D, a different representation (continuous line _____, dashed line ----, chain line -.-.-.-.-, cross line --+---+---+---) is used for the signals for the various LD channels only in those intervals where these signal differ.

In such an activation sequence, the "first" switch S1 is turned off (non-conductive) in order to generate a current pulse that has a duration equal to the sum of total pulses duration.

The capacitor Cr is charged at a voltage value adequate to obtain a desired current in the resonant tank Lr, Cr.

In response to S1 being switched on (made conductive), the resonant tank Lr, Cr starts to oscillate and the current rises in the inductor Lr.

The switch S2_j corresponding to the laser LD_j to be activated first is switched on (made conductive) and in response to the current of the resonant tank Lr, Cr reaching a threshold value, S1 is switched off (non-conductive) for a time corresponding to the sum of the duration of all the pulses desired to be generated.

The switch S2_j previously made conductive is switched off (non-conductive) and the (consecutive) switch S2_j+1 is switched on (made conductive) so that the current will be deviated from the laser diode LD_j to the laser diode LD_j+1, that is another (e.g. adjacent) laser diode in the array to be activated.

The same operation discussed previously can be repeated with S2_j+1 turned off (non-conductive) and the following switch S2_j+2 turned on (made conductive), and so on.

In response to the activation sequence having reached the last laser diode in the array, the switch S1 is turned on (made conductive) again, so that current will no longer flow in the laser diodes LD_j j=1, . . . , n) and after a certain delay (or even at the same time) all the switches S2_j (j=1, . . . , n) are turned off (non-conductive).

When (end of) resonant time is reached, at zero current crossing, as discussed previously, S1 is turned off (non-conductive) and the voltage on Cr will rise up to the value defined by the residual energy of the resonant tank Lr, Cr.

In the sequence exemplified in FIGS. 3 and 3A to 3E, the commutation loop "migrates" in a virtually seamless manner from S1 to S2_1, LD_1 in a first commutation CL1 and to S2_2, LD_2 in a second commutation CL2 and so on for the other laser diode activations up to CLn.

This approach facilitates having a short length of the commutation loops (and hence reduced stray inductances), with the same circuit topology already discussed in connection with FIG. 2.

FIG. 4 (where parts, elements or components like parts, elements or components already discussed in connection with the previous figures are designated with like reference symbols without repeating a corresponding detailed description) illustrates a possible option in the implementation of the switches (transistors) S2_j and S3j (j=1, . . . , n).

In one or more embodiments as discussed herein, the switches (transistors) S1 and S2_j (J=1, . . . , n) may be advantageously implemented as GaN transistors.

This facilitates a monolithic solution, for instance with current GaN technology.

The transistor S1 can be dimensioned depending on the value of rms and peak current in the resonant tank Lr, Cr and the transistors S2_j can be dimensioned depending on the value of rms and peak current in the laser diodes LDJ.

The transistors S3_j (which may be conventional field-effect transistors such as MOSFET transistors) can be integrated in the associated driving circuits 10j since these transistors only drain (very) low currents, that is the parasitic currents flowing in the output capacitance of the associated transistor S2_j.

Figures 5, 6, 7:
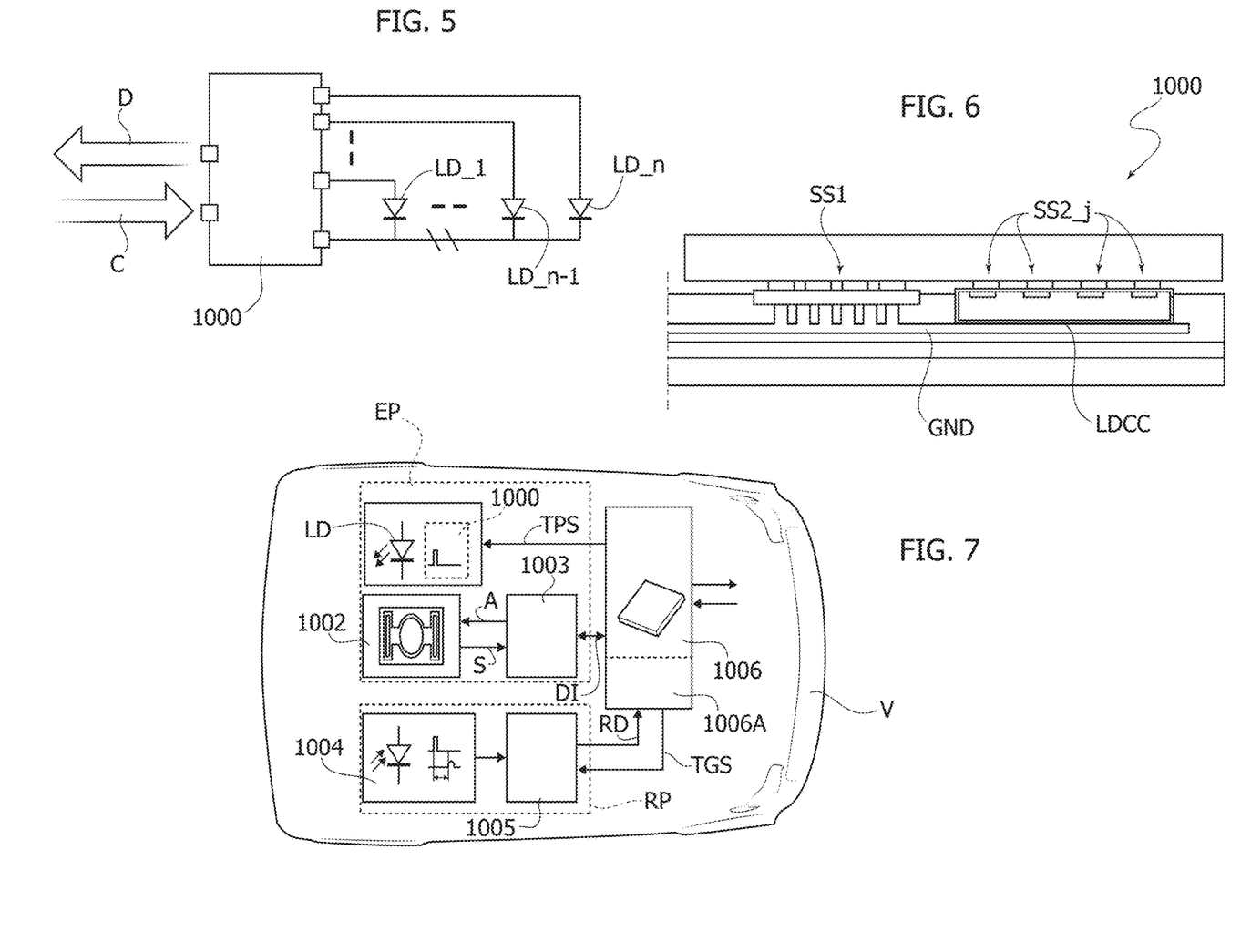
FIG. 5 is a general representation of a system as per embodiments of the present description.
FIG. 6 is illustrative of possible integration of a system as per embodiments of the present description.
FIG. 7 is illustrative of a possible architecture of an automotive LIDAR system including embodiments of the present description.

As exemplified in FIG. 5, such an implementation may facilitate integrating in an integrated circuit (IC) such as a system on package 1000 a driver for high-current, short-pulse (ns range) laser diodes LD_1, . . . , LDn for LIDAR applications, with switches S1 and S2_j implemented with GaN transistors.

This further indicates that the laser diodes LD_1, LD_2, . . . , LD_n may be distinct elements with respect to the integrated system 1000, with the laser diodes LD_1, LD_2, . . . , LD_n intended to be coupled with the IC 1000 only by a final customer/user.

As illustrated in FIG. 5 the system 1000 may perform additional functions for pulse timing and current control (designated C as a whole) and diagnostics (designated D). It is noted that such a configuration is not per se dedicated to a multi-channel laser driver and a laser array and can be used also for a single-channel configuration, include a single laser diode (n=1).

FIG. 6 is a schematic representation of a possible IC implementation of a 4-channel laser driver 1000 including integrated GaN transistors in a 4-layer PCB layout.

In FIG. 6, SS1 denotes the source for S1 and SS2j (j=1, . . . , 4) denotes the sources for S2_1, S2_2, S2_3 and S2_4. The laser common cathode is designated LDCC and the ground is designated GND.

FIG. 7 is exemplary of the possible use of embodiments herein in LIDAR equipment for a vehicle V such as a motor car, the equipment including an emitter path EP and a receiver path RP.

As illustrated, the emitter path EP comprises:

a laser illumination module in turn including a laser diode (array) designated LD with an associated driver system such as 1000 as discussed in the foregoing;

a LIDAR mirror module 1002 (a MEMS mirror module, for instance) receiving actuation signals A from and providing sensing signals S to a mirror driver (an ASIC, for instance) 1003, for instance with the capability of illuminating a surrounding scenery with a vertical laser beam and scanning horizontally as desirable in order to detect in a reliable manner a pedestrian at a few meter distance.

As illustrated, the receiver path RP comprises:

a photodiode module 1004 sensitive to the reflected signal produced as a result of reflection of the light radiation from the emitter path EP on objects illuminated by that radiation, and associated receiver circuitry 1005 coupled to the photodiode module 1004.

Reference 1006 in FIG. 7 denotes a controller (a multi-core microcontroller architecture, for instance, possibly including FPGA/dedicated LIDAR hardware accelerators 1006A) configured to:

issue trigger and laser power setting signals TPS to the system 1000 in the laser illumination;

exchange drive information DI with the driver 1003 of the LIDAR mirror module 1002; and receive raw data RD from and send trigger and gain setting information TGS to the receiver circuitry 1005 coupled to the photodiode module 1004.

It is noted that, with the exception of the features of the laser illumination module discussed herein, the architecture illustrated in Figured 7 may be regarded as otherwise conventional in the art, which makes it unnecessary to provide a more detailed description herein.

This applies, for instance, in respect of the coordination of operation of the LIDAR equipment of FIG. 7 with the operation of other equipment in the vehicle V (for instance in view of configuration data received at the controller 1006 and status point cloud information as issued from the controller 1006).

To sum up, circuits as exemplified herein facilitate fast switching with rise and fall times in the 100 ps range which in turn facilitates the generation of controlled pulses in the ins range with current amplitude in the tens of ampere range.

In circuits as exemplified herein:

pulse current amplitude control is facilitated with reduced parasitic inductance in the commutation loop;

supply voltage can be lower than the laser diode voltage drop;

common cathode configurations can be used in multi-channel laser diode arrangements, avoiding undesired spurious turn-on of non-active laser diodes;

stray inductance in the commutation loops are reduced (below 0.1 nH, for instance) due to the presence of a single common switch such as S1 and (very) short interconnections to the laser diodes: as noted, conventional circuits may include an additional capacitor in the commutation loop and the related interconnections may exhibit parasitic inductances are high as 1 nH (or more) as a result of the connection length related to the size of the capacitor;

switches such as S1 and S2_j can be implemented with a monolithic common drain GaN transistor arrangement, which facilitates optimizing the commutation loop to reduced values thanks to possible integration;

switch such as S3_j (which counter spurious laser turn on) can be integrated in standard IC technology insofar as spurious currents are limited in amplitude and duration;

the voltage across the switch S1 is limited to the (maximum) drop on the laser diodes, which contributes to reducing the commutation delay due to stray capacitance charge of the switch;

current pulse amplitude can be set by the resonant circuit and does not depend on the impedance of the commutation loop;

laser diodes can be driven by a current generator using the inductive energy stored in the resonant circuit this is in contrast with conventional circuits based on storage capacitor discharge, where the current may depend on various parameters (capacitance values, impedance of storage capacitor plus the laser diode plus the interconnections) that are hardly controllable;

the resonant Lr, Cr circuit facilitates inductance pre-charge using a low voltage source; the inductance behaves as an ideal current generator and the voltage drop on the laser diode can be higher than the supply voltage; and the energy storage capacitor is excluded from the commutation loop, so the interconnection length and stray inductance in the commutation loop can be significantly reduced (below 0.1 nH).

Additional advantages of circuits as exemplified herein include an easy control of the pulse current amplitude via the resonant circuit and energy recovery due to the resonant operation.

A driver circuit as exemplified herein includes three types of switches, namely S1, S2_j and S3_j with different functions.

The switch S1 drives a resonant circuit and generates a sinusoidal current wave with a well controlled amplitude and frequency. The switch S1 is switched off (non-conductive) during the resonant period for a short time, so the current flowing in the resonant tank can be deviated in a very short time to a laser diode to be activated.

The switches S2_j are directly in series with the laser diode LD_n and, when switched on (made conductive) the resonant current is forced to flow through the laser diode LD_n when S1 is switched off: this facilitates extremely fast commutations with di/dt>500 A/ns.

Also, since S1 is in parallel with the laser diodes (plus S2_j in an on state), the voltage on S1 is limited and hence the delay related to charging its output capacitance is reduced.

As noted, switches such as S3_j can effectively counter spurious laser turn on and can be integrated in standard IC technology insofar as these spurious currents are limited in amplitude and duration.

A corresponding topology can be integrated in a system in package embedding fast power transistors (for example GaN transistors) together with driving and diagnostic circuitry.

A pulse generator circuit (for instance, 100) as exemplified herein may comprise:

an LC resonant circuit (for instance, Lr, Cr) comprising a series connection of an inductance (for instance, Lr) and a capacitance (for instance, Cr) having an intermediate node (for instance, 14) therebetween, the LC resonant circuit coupled between a first node (for instance, 12) and a reference node (for instance, GND);

charge circuitry (for instance, 16) coupled between a supply node (for instance, VCC) and the intermediate node in the LC resonant circuit to charge the capacitance in the LC resonant circuit;

a first electronic switch (for instance, S1) coupled between the first node and the reference node;

at least one second electronic switch (for instance, S2_1, . . . , S2_n) coupled between the first node and a respective drive node (for instance, 121, . . . , 12*n*) configured to be coupled to a respective electrical load (for instance, LD_1, . . . , LD_n); and drive circuitry (for instance, 18, 182_1, . . . , 182_*n*; 201, 202, 203) of the first electronic switch and the at least one second electronic switch, the drive circuitry configured to repeat pulse generation cycles comprising:

closing the first electronic switch, wherein the LC resonant circuit is enabled to oscillate with an increasing current flowing in the inductance of the LC resonant circuit, in response to the current flowing in the inductance of the LC resonant circuit reaching a threshold value, opening the first electronic switch wherein, as a result of the at least one second electronic switch being closed for a respective pulse duration time (for instance, Ton_S2_1, . . . , Ton_S2_*n*) the current flowing in the inductance of the LC resonant circuit is commutated (during the respective pulse duration time) towards the at least one second electronic switch and the respective drive node to which the at least one second electronic switch is coupled, and opening the at least one second electronic switch at the expiration of the respective pulse duration time.

A pulse generator circuit as exemplified herein may comprise a plurality of second electronic switches (for instance, S2_1, . . . , S2_*n*) coupled between the first node and respective drive nodes (for instance, 121, . . . , 12*n*) configured to be coupled to respective electrical loads, wherein the drive circuitry is configured to repeat pulse generation cycles comprising:

in response to the current flowing in the inductance of the LC resonant circuit reaching a threshold value, opening the first electronic switch wherein the current flowing in the inductance of the LC resonant circuit is sequentially commutated (see, for instance, CL1, CL2, . . . CLn) towards respective ones of the second electronic switches in the plurality of second electronic switches and the respective drive nodes to which the second electronic switches are coupled as a result of the respective ones of the second electronic switches in the plurality of second electronic switches being sequentially closed for respective pulse duration times, and opening the second electronic switches in the plurality of second electronic switches at the expiration of the respective pulse duration times.

In a pulse generator circuit as exemplified herein, the drive circuitry may be configured to sequentially close the second electronic switches in the plurality of second electronic switches for respective pulse duration times having separation delays therebetween (see FIGS. 2A to 2E, for instance).

In a pulse generator circuit as exemplified herein, the drive circuitry may be configured (for instance, 201, 202, 203) to alternately open and close the first electronic switch at each of the respective pulse duration times having separation delays therebetween.

In a pulse generator circuit as exemplified herein, the drive circuitry may be configured to sequentially close the second electronic switches in the plurality of second electronic switches for contiguous pulse duration times (see FIGS. 3A to 3E, for instance).

In a pulse generator circuit as exemplified herein, the drive circuitry may be is configured to keep the first electronic switch open for a time duration cumulative (that is, comprising the sum) of the contiguous pulse duration times.

In a pulse generator circuit as exemplified herein:

the at least one second electronic switch may have associated a respective third electronic switch (for instance, S3_1, . . . , S3_*n*) coupled between the respective drive node and the reference node, and the drive circuitry may be configured to selectively close the third electronic switch to couple the respective drive node to the reference node wherein spurious currents therebetween are short-circuited.

In a pulse generator circuit as exemplified herein, the drive circuitry may be configured to:

close the first electronic switch to enable the LC resonant circuit to oscillate with an increasing current flowing in the inductance of the LC resonant circuit, and open the first electronic switch in response to the current flowing in the inductance of the LC resonant circuit gradually dropping as a result of the current being commutated towards the at least one second electronic switch and the respective drive node to which the at least one second electronic switch is coupled (and thus applied to the electrical loads LD_1 to LD_n in turn supplied thereby).

In a pulse generator circuit as exemplified herein, the first electronic switch and the at least one second electronic switch may comprise Gallium Nitride, GaN transistors.

In a pulse generator circuit as exemplified herein, the inductance and the capacitance in the LC resonant circuit may be coupled:

between the first node and the intermediate node, and between the intermediate node and the reference node, respectively.

A system (for instance, 1000, LD) as exemplified herein may comprise:

a pulse generator circuit as exemplified herein, and at least one electrical load (for instance, LD_1, . . . , LD_n) coupled to the at least one second electronic switch at the respective drive node.

In a pulse generator circuit as exemplified herein, the at least one electrical load may comprise at least one laser diode.

In a pulse generator circuit as exemplified herein, the at least one laser diode may have its anode coupled to the respective drive node and its cathode coupled to the reference node.

A pulse generator circuit as exemplified herein may comprising a plurality of laser diodes having their anodes coupled to the respective drive nodes and their cathodes coupled to the reference node in a common-cathode configuration.

A method of operating a pulse generator circuit or a system as exemplified herein (wherein the circuit comprises a plurality of the second electronic switches having associated respective third electronic switches) may comprise:

sequentially closing for respective pulse duration times (for instance, Ton_S2_1, . . . , Ton_S2_*n*) the second electronic switches in the plurality of second electronic switches, wherein during each one of the respective pulse duration times one second electronic switch in the plurality of second electronic switches is closed while the other second electronic switches in the plurality of second electronic switches are open, and during each one of the respective pulse duration times, closing the third electronic switches associated to the other second electronic switches in the plurality of second electronic switches which are open and closing the third electronic switches associated to one second electronic switch in the plurality of the second electronic switch which is closed.

In various embodiments, a LIDAR system for use in the automotive sector, for instance comprising an array of laser diodes, may be exemplary of such a system.

One or more embodiments comprise an energy storage capacitance and a driver which excludes the energy storage capacitance from the commutation loop, so the interconnection length and stray inductance in the commutation loop can be significantly reduced (below 0.1 nH, for instance).

In one or more embodiments, the driver circuit may include various switches with different functions.

A first switch drives a resonant circuit or tank and generates a sinusoidal current wave with a well controlled amplitude and frequency. That switch is switched off (opened) for a short time during the resonant period and the current flowing in the resonant tank can be commutated (deviated) in a very short time to a laser diode to be activated.

One or more embodiments may contemplate using plural laser diodes in an array. These laser diodes can be selected for activation via respective second switches in series with respective laser diodes so that the resonant current is forced to flow through the laser diode selected when the first switch is switched off. This facilitates achieving fast commutation with di/dt>500 A/ns.

Moreover, with the first switch in parallel with the selected laser diode, the voltage across the first switch is limited, thus reducing the delay due to charging its output capacitance.

One or more embodiments facilitate controlling the pulse current amplitude via the resonant circuit and energy recovery due to resonant operation.

One or more embodiments may provide one or more of the following advantages:

fast switching with rise and fall times in the order of 100 ps facilitate controlled generation of pulses in the ins range with current amplitudes in the range of tens of ampere; this is in contrast with 1 ns rise and fall times of conventional solutions where the similar current amplitudes can be reached only with pulse lengths between 2 and 5 ns;

facilitated pulse current amplitude control;

reduced parasitic inductance in the commutation loop;

supply voltage can be made lower than laser diode voltage drop;

multichannel driver operation is facilitated also for laser diode arrays comprising laser diodes in a common cathode configuration;

spurious turn on of inactive laser diodes can be countered and virtually eliminated.

Without prejudice to the underlying principles, the details of construction and the embodiments may vary widely with respect to what has been described and illustrated herein purely by way of example, without thereby departing from the scope of the embodiments.

The extent of protection is determined by the annexed claims.

What is claimed is:

1. A pulse generator circuit comprising:
    an LC resonant circuit coupled between a first node and a ground;
    a charging circuit coupled to the LC resonant circuit;
    a first electronic switch coupled between the first node and the ground in parallel with the LC resonant circuit;
    a switching network comprising:
        a second electronic switch coupled between the first node and a respective drive node of the switching network, wherein the respective drive node is different from the first node and configured to be coupled to a respective electrical load; and
        a third electronic switch coupled between the respective drive node and the ground; and
    a drive circuit having outputs coupled to the first electronic switch and to the second electronic switch of the switching network, the drive circuit configured to, in repeating cycles:
        close the first electronic switch so that a current flowing through an inductor of the LC resonant circuit increases during a resonant cycle,
        when the current flowing through the inductor reaches a threshold value, open the first electronic switch,
        close the second electronic switch of the switching network for a pulse duration time when the first electronic switch is open, wherein the current flowing through the inductor is commutated toward the second electronic switch and the respective drive node,
        open the second electronic switch at an expiration of the pulse duration time, and
        selectively close the third electronic switch to short circuit spurious current between the respective drive node and the ground.

2. The pulse generator circuit of claim 1, wherein:
    the switching network comprises a plurality of switching networks configured to be coupled to a corresponding plurality of electronic loads; and
    the drive circuit is configured to, in each of the repeating cycles, perform the steps of closing the second electronic switch and opening the second electronic switch sequentially for each switching network, wherein each second switch is sequentially closed for the pulse duration time and then open after the expiration of the pulse duration time, wherein the current flowing in the inductor is sequentially commutated to each second electronic switch of each of the plurality of switching networks.

3. The pulse generator circuit of claim 2, wherein the drive circuit is configured to provide a separation delay between a first time when the second electronic switch of a first switching network of the plurality of switching networks is opened, and a second time when the second electronic switch of a second switching network of the plurality of switching networks is closed.

4. The pulse generator circuit of claim 2, wherein the drive circuit is configured to sequentially close the second electronic switches of the plurality of switching networks for contiguous pulse duration times.

5. The pulse generator circuit of claim 3, wherein the drive circuit is configured to alternatingly open and close the first electronic switch while opening and closing the second switches of the plurality of switching networks, wherein the first electronic switch is open during the pulse duration time and closed during the separation delay.

6. The pulse generation circuit of claim 4, wherein the drive circuit is configured to keep the first electronic switch open for a time duration cumulative of the contiguous pulse duration times.

7. The pulse generator circuit of claim 1, wherein the drive circuit is configured to:
    close the first electronic switch to enable the LC resonant circuit to resonate with an increasing current flowing in the inductor; and
    open the first electronic switch in response to the current flowing in the inductor decreasing as a result of the current being commutated toward the second electronic switch of the switching network and the respective drive node.

8. The pulse generator circuit of claim 1, wherein the first electronic switch and the second electronic switch each comprises a Gallium Nitride (GaN) transistor.

9. The pulse generator circuit of claim 1, wherein the LC resonant circuit comprises a capacitor coupled between the ground and an intermediate node, and the inductor coupled between the intermediate node and the first node.

10. The pulse generator circuit of claim 9, wherein the charging circuit is coupled to the intermediate node of the LC resonant circuit.

11. A system comprising:
the pulse generator circuit according to claim 1; and
the respective electrical load.

12. The system of claim 11, wherein the respective electrical load comprises a laser diode.

13. The system of claim 12, wherein the laser diode comprises an anode coupled to the respective drive node, and a cathode coupled to the ground.

14. A laser diode system comprising:
a pulse generator comprising:
an LC resonant circuit coupled between a first node and a ground,
a first electronic switch coupled between the first node and the ground in parallel with the LC resonant circuit, and
a plurality of switching networks that each comprises:
a second electronic switch coupled between the first node and a respective drive node of the switching network, wherein the respective drive node is different from the first node and configured to be coupled to a respective laser diode of a plurality of laser diodes; and
a third electronic switch coupled between the respective drive node and the ground; and
a driver circuit configured to:
close the first electronic switch so that a current flowing through an inductor of the LC resonant circuit increases during a resonant cycle,
open the first electronic switch in response to the current flowing through the inductor reaching a threshold value,
sequentially close the second switches of the plurality of switching networks for respective pulse duration times such that each second switch being closed and the first electronic switch being open overlap, wherein, during each respective pulse duration time, the second electronic switch of the respective switching network of the plurality of switching networks is closed while second electronic switches of the other switching networks of the plurality of switching networks are open,
open each second switch of the plurality of switching networks after an expiration of its respective pulse duration time, and
selectively close the third electronic switch of the respective switching network to short circuit spurious current between the respective drive node and the ground.

15. The laser diode system of claim 14, further comprising a charging circuit coupled to the LC resonant circuit.

16. The laser diode system of claim 14, further comprising the plurality of laser diodes configured to be coupled to corresponding drive nodes of each of the plurality of switching networks.

17. A method of operating a pulse generator circuit comprising an LC resonant circuit coupled between a first node and a ground, a first electronic switch coupled between the first node and the ground in parallel with the LC resonant circuit, and a plurality of switching networks that each comprises a second electronic switch coupled between the first node and a respective drive node associated with its respective switching network, and a third electronic switch coupled between the respective drive node and the ground, the respective drive node different from the first node and configured to be coupled to a respective electrical load of a plurality of electrical loads, the method comprising:
closing the first electronic switch so that a current flowing through an inductor of the LC resonant circuit increases during a resonant cycle;
opening the first electronic switch in response to the current flowing through the inductor reaching a threshold value;
sequentially closing the second switches of the plurality of switching networks for respective pulse duration times such that each second switch being closed and the first electronic switch being open overlap, and, during each respective pulse duration time, the second electronic switch of the respective switching network of the plurality of switching networks is closed while second electronic switches of the other switching networks of the plurality of switching networks are open;
opening each second switch of the plurality of switching networks after an expiration of its respective pulse duration time;
closing the third electronic switch of the respective switching network when opening the second electronic switch, so as to short circuit spurious current between the respective drive node and the ground; and
opening the third electronic switch of the respective switching network when closing the second electronic switch.

18. The method of claim 17, further comprising charging the LC resonant circuit using a charging circuit.

19. The method of claim 17, wherein the plurality of electrical loads comprises a plurality of laser diodes, and the method further comprises driving the laser diodes via the second switches of the plurality of switching networks.

20. The method of claim 17, further comprising providing a separation delay between a first time when the second electronic switch of a first switching network of the plurality of switching networks is opened, and a second time when the second electronic switch of a second switching network of the plurality of switching networks is closed.

21. The method of claim 17, further comprising sequentially closing the second electronic switches of the plurality of switching networks for contiguous pulse duration times.

* * * * *